US005319164A

United States Patent [19]

Shen

[11] Patent Number: 5,319,164

[45] Date of Patent: Jun. 7, 1994

[54] SPEAKER HOLDER

[75] Inventor: Wem-Tung Shen, Chung Ho, Taiwan

[73] Assignee: A - Sonic Electrics Co. Ltd., Taipei Hsin, Taiwan

[21] Appl. No.: 149,372

[22] Filed: Nov. 9, 1993

[51] Int. Cl.[5] .............................................. H05K 5/00

[52] U.S. Cl. .................................. 181/150; 181/153; 181/154

[58] Field of Search ............... 181/141, 149, 150, 153, 181/154, 171, 199; 381/188, 189, 205

[56] References Cited

U.S. PATENT DOCUMENTS 3,500,953 3/1970 Lahti .................................. 181/153
3,719,250 3/1973 Maekawa ............................ 181/153
4,917,212 4/1990 Iwaya ............................. 181/150 X
5,133,428 7/1992 Perrson .............................. 181/153

*Primary Examiner*—Michael L. Gellner
*Assistant Examiner*—Khanh Dang
*Attorney, Agent, or Firm*—Larson and Taylor

[57] ABSTRACT

A speaker holder includes a hollow, open holder body which receives a speaker within an inward top flange thereof, a bottom plate fastened to the holder body at the bottom to hold a spring-supported ball in a center hole on an upright center rod thereof for permitting the speaker to be balanced on the ball, and a mounting plate detachably fastened to the bottom plate through hooked joints for mounting the speaker holder on a supporting surface.

2 Claims, 2 Drawing Sheets

SPEAKER HOLDER

BACKGROUND OF THE INVENTION

The present invention relates to a speaker holder which permits the speaker to be tilted in either direction within 90° angle.

A commonly known speaker holder which permits the speaker to be tilted in either direction is generally comprised of a holder body to hold the speaker, and a spring retained inside the holder body to support the speaker against an inward top flange around the top opening of the holder body. As the speaker is directly supported on the spring, turning the speaker causes the speaker to rub against the inward top flange of the holder body, and therefore the speaker may be damaged easily.

SUMMARY OF THE INVENTION

The present invention has been accomplished to provide a speaker holder which eliminates the aforesaid problem. The present invention uses a ball to support the speaker above the spring for permitting the speaker to be smoothly tilted in either direction within 90° angle. Because the speaker is balanced on the ball, it can be smoothly turned in either direction without causing much friction force, and therefore the service life of the speaker as well as the speaker holder can be greatly prolonged.

DETAILED DESCRIPTION OF THE PREFERRED EMBODIMENT

Figure 1:
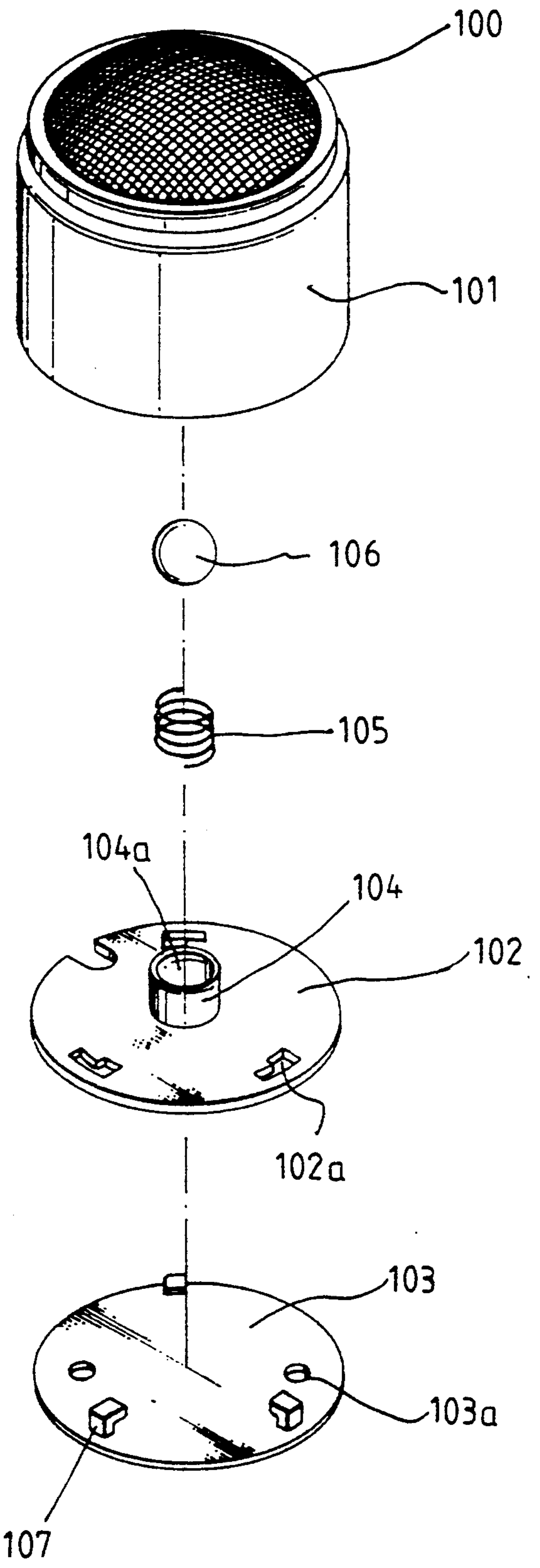
FIG. 1 is an exploded view of a speaker holder according to the preferred embodiment of the present invention.

Referring to FIG. 1, a speaker holder in accordance with the present invention is generally comprised of a holder body 101 to hold a speaker 100, a bottom plate 102 and a mounting plate 103 respectively fastened to the holder body 101 at the bottom. The bottom plate 102 comprises an upright stub rod 104 in the center, and a plurality of stepped retaining holes **102*a* equiangularly spaced around the upright stub rod 104. The upright stub rod 104 has a center hole 104*a*, which receives a spring 105 and a ball 106 above the spring 105. The mounting plate 103 comprises a plurality of equiangularly spaced mounting holes 103*a*, through which the mounting plate 103 can be fastened to a flat surface by screws or suitable fastening elements, and equiangularly spaced hooks 107 respectively hooked in the stepped retaining holes 102*a* on the bottom plate 102**.

Figure 2:
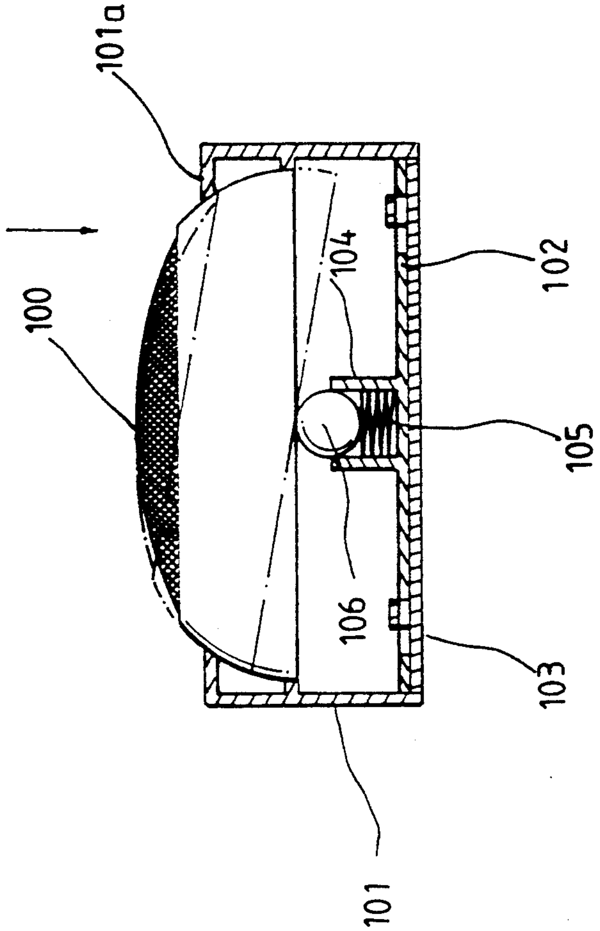
FIG. 2 is a longitudinal view in section of the speaker holder of FIG. 1.

Referring to FIG. 2, the ball 106 is supported on the spring 105 and partially extended out of upright stub rod 104 to support the speaker 100 within the inward top flange **101*a* of the holder body 101. By means of pressing the speaker 100 to compress the spring 105, the speaker 100 can be tilted in either direction within 90° angle. After the hand was released from the speaker 100, the spring 105 immediately pushes the ball 106 back to its former position, and therefore the speaker 100** is retained in the adjusted position.

What is claimed is:

1. A speaker holder comprising a hollow, open holder body having a top opening and an inward top flange around said top opening, a speaker held in said holder body within said inward top flange, a bottom plate fastened to said holder body and spaced from said top opening, and a mounting plate connected to said bottom plate for fastening it to a supporting surface, said bottom plate comprising an upright center rod having a center hole, a spring received within the center hole of said upright center rod, a ball supported on said spring and partially extended out of said upright center rod to support said speaker inside said holder body within said inward top flange.

2. The speaker holder of claim 1 wherein said bottom plate has a plurality of stepped retaining holes spaced around said upright center rod; said mounting plate has a plurality of hooks respectively hooked in said stepped retaining holes on said bottom plate.

* * * * *